(12) United States Patent
Inoue (10) Patent No.: US 12,464,715 B2
(45) Date of Patent: Nov. 4, 2025

(54) SEMICONDUCTOR DEVICE

(71) Applicant: Kioxia Corporation, Tokyo (JP)

(72) Inventor: Keitaro Inoue, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 549 days.

(21) Appl. No.: 17/901,506

(22) Filed: Sep. 1, 2022

(65) Prior Publication Data

US 2023/0292502 A1    Sep. 14, 2023

(30) Foreign Application Priority Data

Mar. 14, 2022   (JP) .................................. 2022-039500

(51) Int. Cl.
| | |
|---|---|
| H10B 41/27 | (2023.01) |
| H10B 41/35 | (2023.01) |
| H10B 43/27 | (2023.01) |
| H10B 43/35 | (2023.01) |
| H10D 30/01 | (2025.01) |
| H10D 30/60 | (2025.01) |
| H10D 30/67 | (2025.01) |

(Continued)

(52) U.S. Cl.
CPC ............. *H10B 41/35* (2023.02); *H10B 41/27* (2023.02); *H10B 43/27* (2023.02); *H10B 43/35* (2023.02); *H10D 30/0227* (2025.01); *H10D 30/601* (2025.01); *H10D 30/6741* (2025.01); *H10D 30/751* (2025.01); *H10D 30/798* (2025.01); *H10D 62/832* (2025.01); *H10D 62/8325* (2025.01)

(58) Field of Classification Search
CPC ............. H10D 30/022; H10D 30/0223; H10D 30/0225; H10D 30/0227; H10D 30/0229; H10D 30/601; H10D 30/603; H10D 30/637; H10D 30/6757; H10D 30/6741; H10D 30/751; H10D 30/791; H10D 30/795; H10D 30/798; H10D 62/832; H10D 62/8325; H10D 62/213; H10D 62/221; H10D 62/235; H10D 30/6743; H10D 41/35; H10D 43/35
See application file for complete search history.

(56) References Cited

U.S. PATENT DOCUMENTS

| | | | |
|---|---|---|---|
| 9,716,172 B2 * | 7/2017 | Yu .......................... | H10D 30/797 |
| 2002/0079507 A1 * | 6/2002 | Shim .................... | H10D 30/473 |
| | | | 257/E21.403 |

(Continued)

FOREIGN PATENT DOCUMENTS

JP        2018-049968 A      3/2018

*Primary Examiner* — Jose R Diaz (74) *Attorney, Agent, or Firm* — Foley & Lardner LLP (57) ABSTRACT

A semiconductor device includes a substrate and a transistor. The transistor has a first diffusion region and a second diffusion region provided in the substrate, a gate insulating film provided over the substrate between the first diffusion region and the second diffusion region, and a gate electrode positioned on the gate insulating film. The semiconductor device further includes an internal layer positioned in the substrate, wherein the internal layer has a first concentration of germanium and carbon higher than a second concentration of germanium and carbon of a region between the first diffusion region and the second diffusion region.

13 Claims, 6 Drawing Sheets

(51) Int. Cl.
*H10D 30/69* (2025.01)
*H10D 62/832* (2025.01)

(56) References Cited

U.S. PATENT DOCUMENTS

| | | | |
|---|---|---|---|
| 2002/0179946 A1* | 12/2002 | Hara | H10D 30/801 257/E29.248 |
| 2008/0224218 A1* | 9/2008 | Liu | H10D 84/017 257/369 |
| 2018/0090511 A1 | 3/2018 | Nakajima | |

* cited by examiner

SEMICONDUCTOR DEVICE

CROSS-REFERENCE TO RELATED APPLICATION(S)

This application is based upon and claims the benefit of priority from Japanese Patent Application No. 2022-039500, filed Mar. 14, 2022, the entire contents of which are incorporated herein by reference.

FIELD

Embodiments described herein relate generally to a semiconductor device.

BACKGROUND

In general, a semiconductor device includes a semiconductor substrate and a transistor provided on the semiconductor substrate.

DETAILED DESCRIPTION

Embodiments provide a semiconductor device such that an improvement in electrical characteristics can be achieved.

In general, according to one embodiment, a semiconductor device includes a substrate and a transistor. The transistor has a first diffusion region and a second diffusion region provided in the substrate, a gate insulating film provided over the substrate between the first diffusion region and the second diffusion region, and a gate electrode positioned on the gate insulating film. The semiconductor device further includes an internal layer positioned in the substrate, wherein the internal layer has a first concentration of germanium and carbon higher than a second concentration of germanium and carbon of a region between the first diffusion region and the second diffusion region.

A semiconductor device of an embodiment will be described, with reference to the drawings. In the following description, identical reference signs will be allotted to configurations having identical or similar functions. Further, a redundant description of these configurations may be omitted. "Parallel", "perpendicular", and "the same" may refer to "approximately parallel", "approximately perpendicular", and "approximately the same", respectively. "Connect" and "connection" are not limited to a mechanical connection, but may refer to an electrical connection. That is, "connect" and "connection" are limited to direct connection between a multiple of elements, but may refer to connection between a multiple of elements with another element interposed. "Opposing" refers to that two members are superimposed when seen in a certain direction, and may also refer to that another member exists between the two members.

Firstly, an X direction, a Y direction, and a Z direction will be defined. The X direction and the Y direction are directions along a surface S of a semiconductor substrate 20 to be described hereafter (refer to FIG. 2). The X direction is a direction heading from a source region 31 to a drain region 32 in a transistor 30A to be described hereafter (refer to FIG. 2). The Y direction is a direction that intersects (for example, is perpendicular to) the X direction. The Z direction is a direction that intersects (for example, is perpendicular to) the X direction and the Y direction. The Z direction is a thickness direction of the semiconductor substrate 20 (refer to FIG. 2). In the following description, a side on which the transistor 30A is positioned with respect to the semiconductor substrate 20 may be called "upper", and an opposite side called "lower". It is noted that these expressions are for the sake of convenience, and do not define a direction of gravitational force.

Embodiment

1. Semiconductor Device Configuration Example

Figure 1:
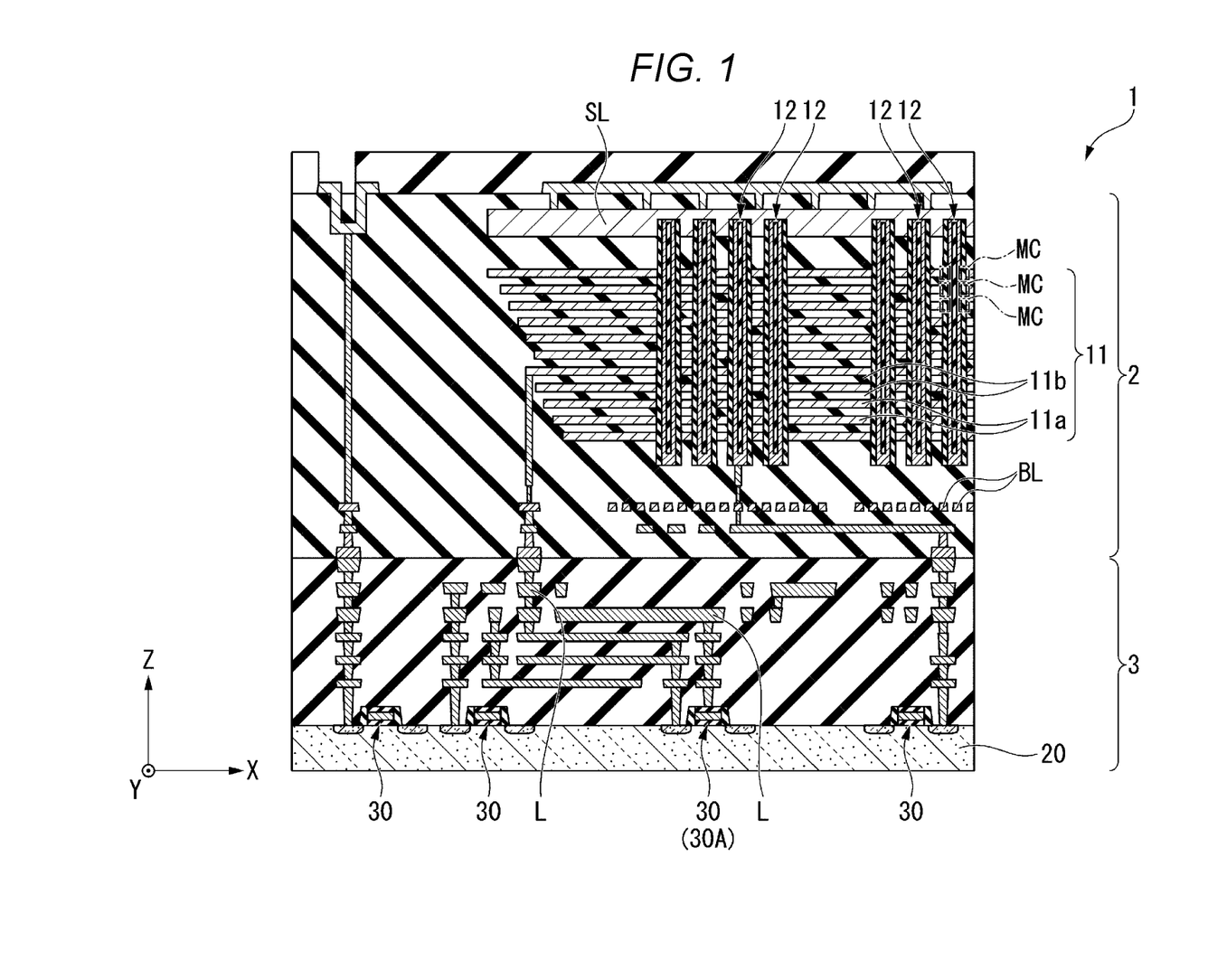
FIG. 1 is a sectional view showing an example of a configuration of a semiconductor device of an embodiment.

FIG. 1 is a sectional view showing an example of a configuration of a semiconductor device 1 of the embodiment. The semiconductor device 1 is, for example, a semiconductor storage device like a NAND flash memory. The semiconductor device 1 has, for example, an array chip 2 and a circuit chip 3.

The array chip 2 is a chip that can store information. The array chip 2 includes, for example, a stacked body 11, a multiple of memory pillars 12, a source line SL, and a multiple of bit lines BL. The stacked body 11 includes a multiple of word lines 11a and a multiple of insulating layers 11b. The multiple of word lines 11a and the multiple of insulating layers 11b are alternately stacked one-by-one in the Z direction.

The multiple of memory pillars 12 extend in the Z direction inside the stacked body 11. Each memory pillar 12 includes, from a central portion of the memory pillar 12 toward an outer peripheral side, an insulating portion, a channel layer, a tunnel insulating film, a charge storage portion, and a block insulating film. An end portion of each memory pillar 12 is connected to the source line SL. Another end portion of each memory pillar 12 is connected to the bit line BL. A memory cell transistor MC is formed in an intersecting portion of each memory pillar 12 and each word line 11a. The memory cell transistor MC is a storage element that can store information owing to a charge being accumulated.

The circuit chip 3 is a control circuit that controls an operation of the array chip 2. The circuit chip 3 includes, for example, the semiconductor substrate 20, a multiple of transistors 30, and a multiple of wirings L. The multiple of transistors 30 are provided on the semiconductor substrate 20. The multiple of transistors 30 include, for example, the transistor 30A (which may hereafter be called the "high voltage transistor 30A"), through which a current of a voltage higher than that of other transistors 30 flows. The high voltage transistor 30A is, for example, connected to the word lines 11a via the wiring L, and controls an application of voltage to the word lines 11a. It is noted that the high voltage transistor 30A is not limited to the heretofore described example, and transistors with various uses may be applied as appropriate.

2. Semiconductor Substrate and Transistor Configurations

Figure 2:
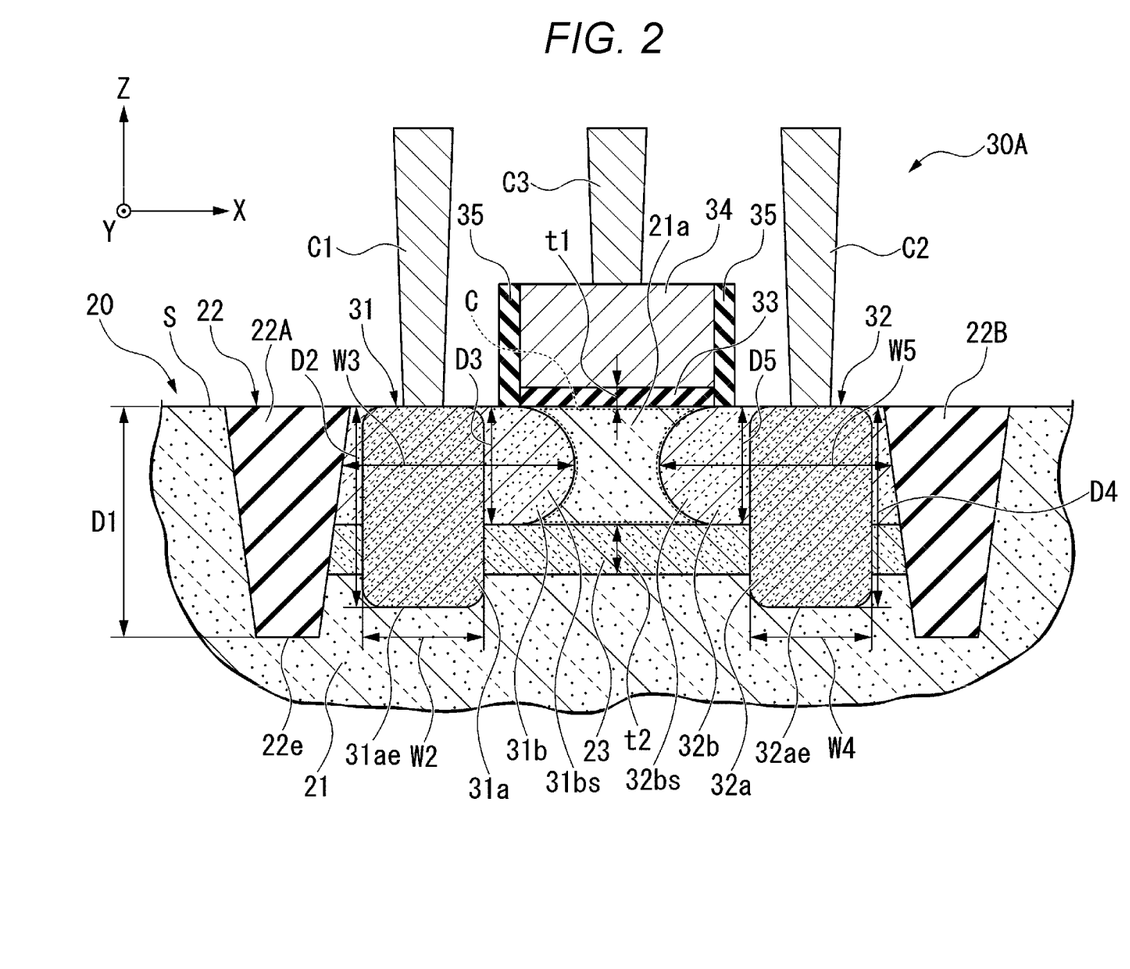
FIG. 2 is a sectional view showing an example of configurations of a semiconductor substrate and a transistor of the embodiment.

Next, configurations of the semiconductor substrate 20 and the transistor 30A will be described in detail.

FIG. 2 is a sectional view showing an example of configurations of the semiconductor substrate 20 and the transistor 30A. A depiction of an insulating portion unrelated to the description is omitted from the drawings to be described hereafter.

2.1 Semiconductor Substrate

The semiconductor substrate 20 is, for example, a silicon substrate. The semiconductor substrate 20 is one example of a "substrate". The semiconductor substrate 20 has, for example, a substrate main body 21, an element isolating portion 22, and a diffusion restricting layer 23.

The substrate main body 21 is a portion forming a base on which the transistor 30A is provided. The substrate main body 21 includes a silicon material. The substrate main body 21 has a well region 21a, of a polarity (a conductivity type) differing from that of the source region 31 and the drain region 32 of the transistor 30A to be described hereafter, in at least a region in which the transistor 30A is provided. The substrate main body 21 forms the surface S of the semiconductor substrate 20. The surface S is, for example, a plane surface following the X direction and the Y direction.

The element isolating portion 22 is an isolating portion that electrically isolates the multiple of transistors 30 provided on the semiconductor substrate 20. The element isolating portion 22 is, for example, provided between the transistor 30A and the other transistors 30. The element isolating portion 22 includes, for example, a first element isolating portion 22A, disposed on one side in the X direction with respect to the transistor 30A, and a second element isolating portion 22B, disposed on another side in the X direction with respect to the transistor 30A. The element isolating portion 22 extends in the Z direction from the surface S of the semiconductor substrate 20 into an interior of the semiconductor substrate 20. In the present embodiment, the element isolating portion 22 extends to a depth D1 seen from the surface S of the semiconductor substrate 20.

The diffusion restricting layer 23 is provided in the interior of the semiconductor substrate 20. The diffusion restricting layer 23 is a layer for restricting a diffusion of an impurity in the Z direction when forming the source region 31 and the drain region 32 of the transistor 30A. The diffusion restricting layer 23 is one example of an "internal layer". The diffusion restricting layer 23 will be described in detail hereafter.

2.2 Transistor

The transistor 30A is a field-effect transistor, for example, a metal-oxide-semiconductor field-effect transistor (MOSFET). The transistor 30A includes, for example, the source region 31, the drain region 32, a gate insulating film 33, a gate electrode 34, and an insulating film 35.

The source region 31 and the drain region 32 are provided as a part of an upper portion of the semiconductor substrate 20 (that is, a part of an upper portion of the substrate main body 21). For example, the source region 31 and the drain region 32 are formed by doping the upper portion of the semiconductor substrate 20 with an impurity. The source region 31 and the drain region 32 are separated from each other in the X direction. For example, each of the source region 31 and the drain region 32 includes an n-type semiconductor. Each of the source region 31 and the drain region 32 may include a p-type semiconductor instead of the aforementioned example. The source region 31 is one example of a "first diffusion layer region," or "first diffusion region." The drain region 32 is one example of a "second diffusion layer region," or "second diffusion region."

In the present embodiment, the source region 31 has a high concentration diffusion region 31a and a low concentration diffusion region 31b. The high concentration diffusion region 31a is a region including an impurity at a first impurity concentration. The first impurity concentration is an impurity concentration of, for example, $1\times10^{17}$ atoms·cm$^{-3}$ or greater. The high concentration diffusion region 31a is provided in a region that is not below the gate electrode 34 (that is, a region that does not coincide with the gate electrode 34 in the Z direction) in the semiconductor substrate 20.

The high concentration diffusion region 31a spreads in the Z direction into the interior of the semiconductor substrate 20 from the surface S of the semiconductor substrate 20. The high concentration diffusion region 31a is formed by, for example, implanting an impurity implanted using a multiple of ion implantations. The high concentration diffusion region 31a exists to a depth D2 seen from the surface S of the semiconductor substrate 20. When there is an inclination in the depth of the high concentration diffusion region 31a, the depth D2 is, for example, a maximum depth. The depth D2 of the high concentration diffusion region 31a in the Z direction is, for example, greater than a width W2 of the high concentration diffusion region 31a in the X direction. The depth D2 of the high concentration diffusion region 31a in the Z direction is, for example, smaller than the depth D1 of the element isolating portion 22 in the Z direction. A contact electrode C1 is provided above the high concentration diffusion region 31a. The contact electrode C1 is connected to the high concentration diffusion region 31a in the Z direction.

The low concentration diffusion region 31b is a region of the same polarity as the high concentration diffusion region 31a, and is a region including an impurity at a second impurity concentration lower than the first impurity concentration. The low concentration diffusion region 31b is shallower and wider than the high concentration diffusion region 31a. The low concentration diffusion region 31b is, for example, a lightly-doped drain (hereafter called LDD) region.

The low concentration diffusion region 31b includes, for example, a portion 31bs (hereafter called a "specific portion 31bs") that coincides with the gate electrode 34 in the Z direction. The specific portion 31bs is one example of a "first portion". In the present embodiment, the low concentration diffusion region 31b is provided from a position nearer than the high concentration diffusion region 31a to the first element isolating portion 22A to a position coinciding with the gate electrode 34 in the Z direction.

The low concentration diffusion region 31b spreads to a depth D3 seen from the surface S of the semiconductor substrate 20. When there is an inclination in the depth of the low concentration diffusion region 31b, the depth D3 is, for example, a maximum depth. The depth D3 of the low concentration diffusion region 31b in the Z direction is, for example, smaller than a width W3 of the low concentration diffusion region 31b in the X direction. In the present embodiment, the depth D3 of the low concentration diffusion region 31b in the Z direction is smaller than the depth D2 of the high concentration diffusion region 31a in the Z direction.

In the same way, the drain region 32 has a high concentration diffusion region 32a and a low concentration diffusion region 32b. The high concentration diffusion region 32a is a region including an impurity at a third impurity concentration. The third impurity concentration is an impurity concentration of, for example, $1\times10^{17}$ atoms·cm$^{-3}$ or greater. The high concentration diffusion region 32a is provided in a region that is not below the gate electrode 34 (that is, a region that does not coincide with the gate electrode 34 in the Z direction) in the semiconductor substrate 20.

The high concentration diffusion region 32a spreads in the Z direction into the interior of the semiconductor substrate 20 from the surface S of the semiconductor substrate 20. The high concentration diffusion region 32a is formed by, for example, implanting an impurity using a multiple of ion implantations. The high concentration diffusion region 32a exists to a depth D4 seen from the surface S of the semiconductor substrate 20. When there is an inclination in the depth of the high concentration diffusion region 32a, the depth D4 is, for example, a maximum depth. The depth D4 of the high concentration diffusion region 32a in the Z direction is, for example, greater than a width W4 of the high concentration diffusion region 32a in the X direction. The depth D4 of the high concentration diffusion region 32a in the Z direction is, for example, smaller than the depth D1 of the element isolating portion 22 in the Z direction. A contact electrode C2 is provided above the high concentration diffusion region 32a. The contact electrode C2 is connected to the high concentration diffusion region 32a in the Z direction.

The low concentration diffusion region 32b is a region of the same polarity as the high concentration diffusion region 32a, and is a region including an impurity at a fourth impurity concentration lower than the third impurity concentration. The low concentration diffusion region 32b is shallower and wider than the high concentration diffusion region 32a. The low concentration diffusion region 32b is, for example, an LDD region.

The low concentration diffusion region 32b includes, for example, a portion 32bs (hereafter called a "specific portion 32bs") that coincides with the gate electrode 34 in the Z direction. In the present embodiment, the low concentration diffusion region 32b is provided from a position nearer than the high concentration diffusion region 32a to the second element isolating portion 22B to a position coinciding with the gate electrode 34 in the Z direction.

The low concentration diffusion region 32b spreads to a depth D5 seen from the surface S of the semiconductor substrate 20. When there is an inclination in the depth of the low concentration diffusion region 32b, the depth D5 is, for example, a maximum depth. The depth D5 of the low concentration diffusion region 32b in the Z direction is, for example, smaller than a width W5 of the low concentration diffusion region 32b in the X direction. In the present embodiment, the depth D5 of the low concentration diffusion region 32b in the Z direction is smaller than the depth D4 of the high concentration diffusion region 32a in the Z direction.

As shown in FIG. 2, a region between the source region 31 and the drain region 32 functions as a channel region C in the substrate main body 21. The channel region C is positioned between the source region 31 and the drain region 32 in the X direction, and includes the well region 21a of a polarity (a conductivity type) differing from that of the source region 31 and the drain region 32. The channel region C includes a region in which an inversion layer is formed when voltage is applied to the gate electrode 34, and current flows between the source region 31 and the drain region 32. The channel region C is one example of a "region between the source region 31 and the drain region 32".

In the present application, a "channel region" not only refers to a region in which an inversion layer is formed, but also means a region of a predetermined range including a region in which an inversion layer is formed. A predetermined range is, for example, a region that is positioned between the source region 31 and the drain region 32 in the X direction, and is a region that has a depth the same as the Z direction depth D3 of the low concentration diffusion region 31b of the source region 31 (or the Z direction depth D5 of the low concentration diffusion region 32b of the drain region 32).

The gate insulating film 33 is positioned between the semiconductor substrate 20 and the gate electrode 34, and is an insulating film that electrically isolates the semiconductor substrate 20 and the gate electrode 34. The gate insulating film 33 is provided on the surface S of the semiconductor substrate 20. At least a part of the gate insulating film 33 opposes the channel region C of the semiconductor substrate 20. The gate insulating film 33 is formed of, for example, a silicon dioxide film.

The gate electrode 34 is positioned on a side of the gate insulating film 33 opposite to that of the semiconductor substrate 20. At least a part of the gate electrode 34 opposes the channel region C of the semiconductor substrate 20 in the Z direction across the gate insulating film 33. The gate electrode 34 is formed of, for example, polysilicon. A contact electrode C3 is provided above the gate electrode 34. The contact electrode C3 is connected to the gate electrode 34 in the Z direction.

The multiple of insulating films 35 are provided divided on either side portion of the gate insulating film 33 and the gate electrode 34 in the X direction. One insulating film 35 covers one side portion of the gate insulating film 33 and the gate electrode 34 in the X direction. Another insulating film 35 covers another side portion of the gate insulating film 33 and the gate electrode 34 in the X direction.

2.3 Diffusion Restricting Layer

Next, the diffusion restricting layer 23 will be described in detail.

In the present embodiment, the diffusion restricting layer 23 is provided in the interior of the semiconductor substrate 20. The diffusion restricting layer 23 is a layer for restricting a diffusion of an impurity in the Z direction when forming the source region 31 and the drain region 32 of the transistor 30A. In further detail, the diffusion restricting layer 23 is a layer for restricting a diffusion of an impurity in the Z direction, and promoting a diffusion of the impurity in the X direction, when forming the low concentration diffusion region 31b of the source region 31 and the low concentration diffusion region 32b of the drain region 32.

The diffusion restricting layer 23 includes a silicon material, and also includes germanium and carbon. The diffusion restricting layer 23 is a layer that has a high concentration of germanium and carbon compared with that of, for example, the channel region C.

The diffusion restricting layer 23 is positioned on a side opposite to that of the surface S of the semiconductor substrate 20 (that is, on a side opposite to that of the insulating film 33) with respect to at least one of at least a part of the source region 31 and at least a part of the drain region 32. In the present embodiment, the diffusion restricting layer 23 covers at least a part of the source region 31, at least a part of the drain region 32, and the channel region C, from below. For example, the diffusion restricting layer 23 covers at least a part of the low concentration diffusion region 31b of the source region 31, and at least a part of the low concentration diffusion region 32b of the drain region 32, from below. For example, the diffusion restricting layer 23 covers at least the specific portion 31bs of the low concentration diffusion region 31b of the source region 31, and the specific portion 32bs of the low concentration diffusion region 32b of the drain region 32, from below.

In the present embodiment, the diffusion restricting layer 23 is provided over a whole region between the first element isolating portion 22A and the second element isolating portion 22B. That is, in the present embodiment, the diffusion restricting layer 23 covers a whole of the low concentration diffusion region 31b of the source region 31, a whole of the low concentration diffusion region 32b of the drain region 32, and a whole of the channel region C, from below.

The diffusion restricting layer 23 is provided in a region deeper than the low concentration diffusion region 31b of the source region 31 and the low concentration diffusion region 32b of the drain region 32 as seen from the surface S of the semiconductor substrate 20. Meanwhile, the diffusion restricting layer 23 is provided in a region shallower than a lower end 22e of the element isolating portion 22 as seen from the surface S of the semiconductor substrate 20. For example, the diffusion restricting layer 23 is provided in a region shallower than a lower end 31ae of the high concentration diffusion region 31a of the source region 31 and a lower end 32ae of the high concentration diffusion region 32a of the drain region 32 as seen from the surface S of the semiconductor substrate 20. That is, the diffusion restricting layer 23 is positioned nearer the surface S of the semiconductor substrate 20 than a part of the high concentration diffusion region 31a of the source region 31 and a part of the high concentration diffusion region 32a of the drain region 32. In the present embodiment, the high concentration diffusion region 31a of the source region 31 has an impurity concentration of $1 \times 10^{17}$ atoms·cm$^{-3}$ or greater as far as a region deeper than the diffusion restricting layer 23. In the same way, the high concentration diffusion region 32a of the drain region 32 has an impurity concentration of $1 \times 10^{17}$ atoms·cm$^{-3}$ or greater as far as a region deeper than the diffusion restricting layer 23.

A thickness t2 of the diffusion restricting layer 23 in the Z direction is, for example, smaller than the depth D3 of the low concentration diffusion region 31b of the source region 31 in the Z direction, and smaller than the depth D5 of the low concentration diffusion region 32b of the drain region 32 in the Z direction.

To facilitate the description, only the diffusion restricting layer 23 existing in a region on an inner side of the element isolating portion 22 corresponding to the transistor 30A is shown in FIG. 2. However, for manufacturing reasons or the like, a part of the diffusion restricting layer 23 may also exist in a region on an outer side of the element isolating portion 22 as seen from the transistor 30A (refer to FIG. 3J).

3. Manufacturing Method

Next, a method of manufacturing the semiconductor device 1 will be described. Herein, a manufacturing method relating to the semiconductor substrate 20 and the transistor 30A will be described. With regard to a manufacturing process for other configurations of the semiconductor device 1, a publicly known method may be used.

Figure 3A:
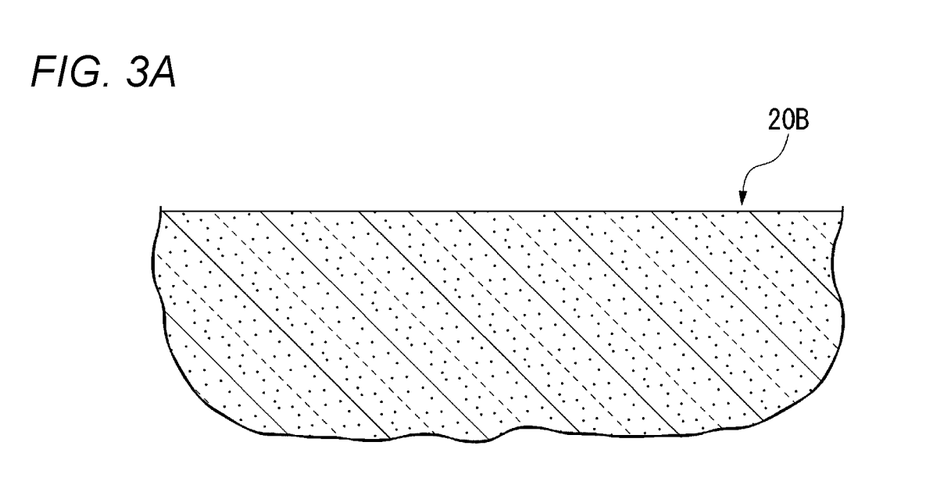
FIGS. 3A to 3J show a method of manufacturing the semiconductor device of the embodiment.

FIGS. 3A to 3J show a method of manufacturing the semiconductor device 1. Firstly, a semiconductor substrate 20B that forms a basis of the semiconductor substrate 20 is prepared, as shown in FIG. 3A.

Figure 3B:
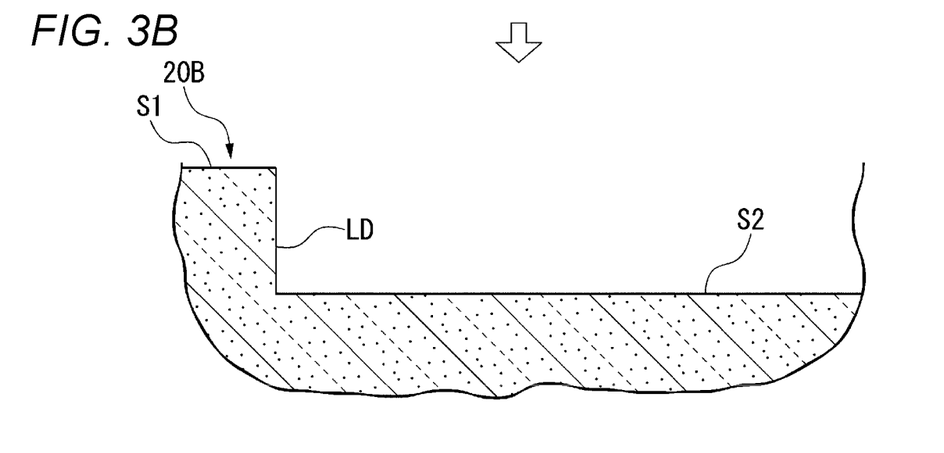

Next, with regard to a region in which the high voltage transistor 30A is provided, a part of an upper portion of the semiconductor substrate 20B is removed by processing, as shown in FIG. 3B. Thereby, the semiconductor substrate 20B has a surface S1, and a surface S2 that is low with respect to the surface S1. The surface S2 is formed in a region in which the high voltage transistor 30A is provided. Meanwhile, the surface S1 is formed in a region in which the transistor 30 to which is applied a voltage that is lower than that applied to the high voltage transistor 30A is provided. A step LD exists between the surface S1 and the surface S2.

Figure 3C:
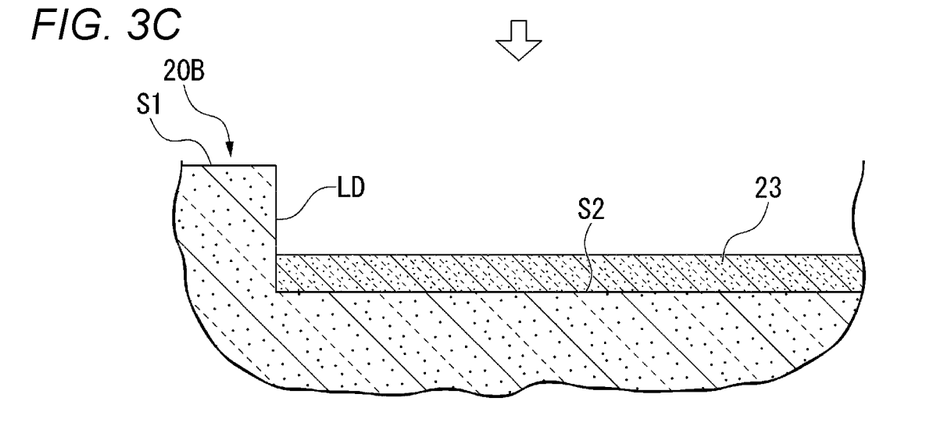

Next, as shown in FIG. 3C, the diffusion restricting layer 23 is formed on the surface S2 of the semiconductor substrate 20B. The diffusion restricting layer 23 is formed by, for example, causing crystal growth to occur using epitaxial growth that uses a silicon material including germanium and carbon.

Figure 3D:
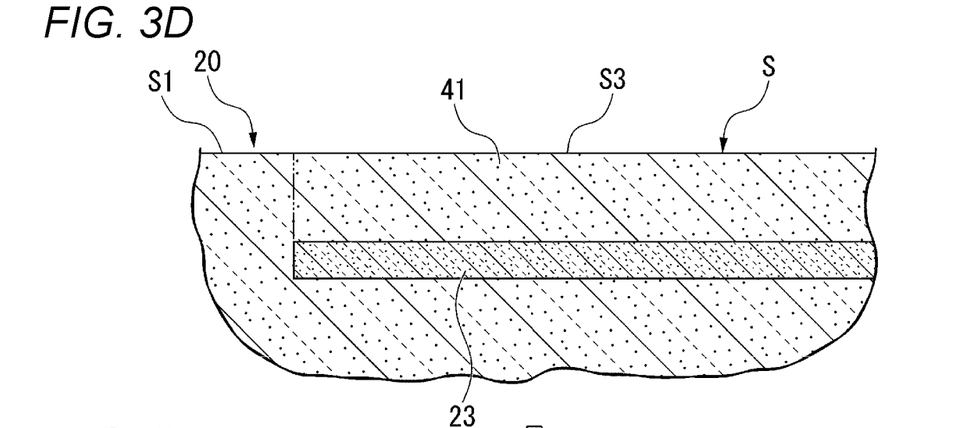

Next, as shown in FIG. 3D, a semiconductor layer 41 is provided in such a way as to cover the diffusion restricting layer 23. The semiconductor layer 41 is formed by, for example, causing crystal growth to occur using epitaxial growth that uses a silicon material. The semiconductor layer 41 is processed in such a way that a surface S3 of the semiconductor layer 41 is the same as the surface S1 of the semiconductor substrate 20B. By so doing, the semiconductor substrate 20 having the surface S is formed.

Figure 3E:
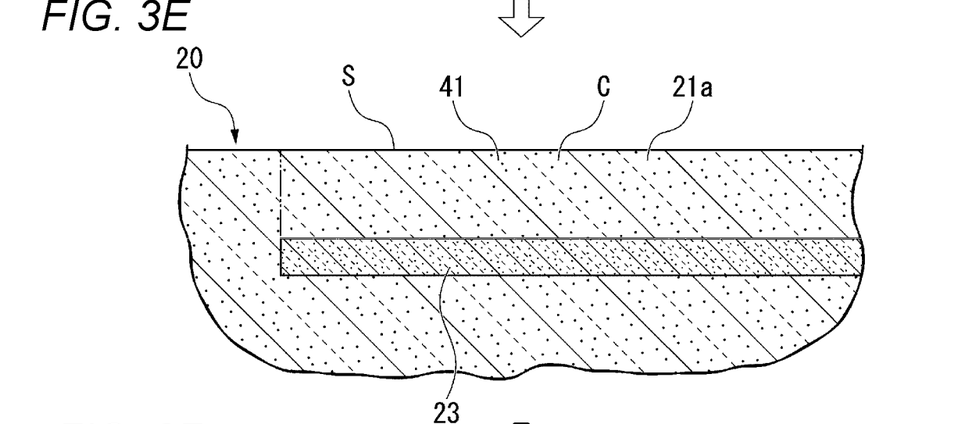
Figure 3F:
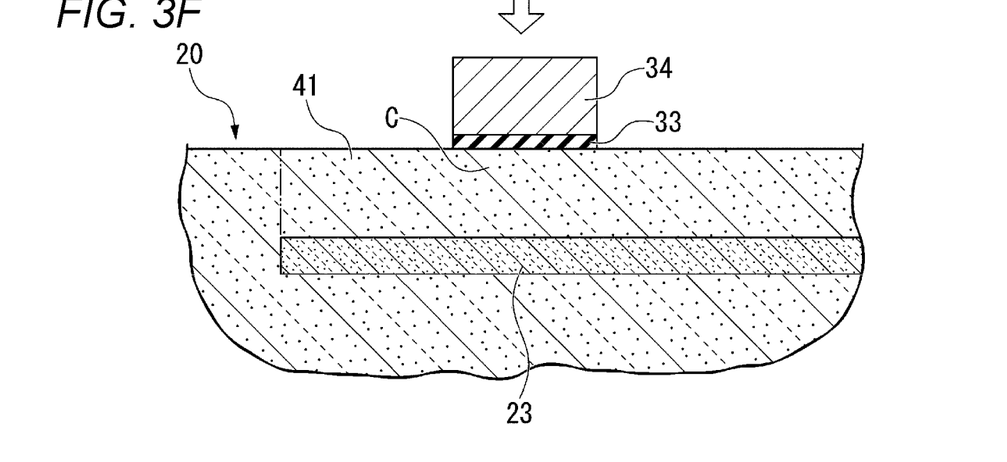

Next, as shown in FIG. 3E, an impurity for forming the well region 21a is implanted into the semiconductor substrate 20. Thereby, the well region 21a is formed in the semiconductor substrate 20. The well region 21a includes at least the channel region C. Next, as shown in FIG. 3F, the gate insulating film 33 and the gate electrode 34 are formed on the surface S of the semiconductor substrate 20.

Figure 3G:
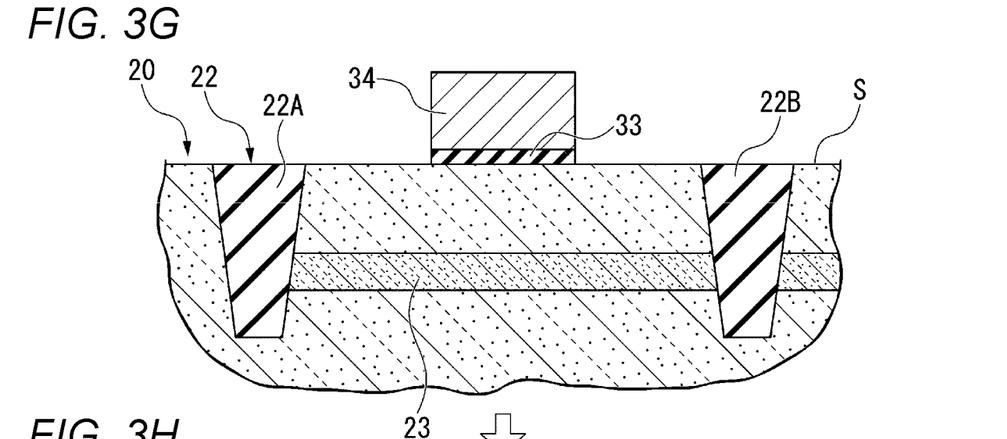

Next, as shown in FIG. 3G, the element isolating portion 22 is provided in the semiconductor substrate 20. The element isolating portion 22 is formed by, for example, the following manner. A groove corresponding to the form of the element isolating portion 22 is formed by carrying out anisotropic etching on the semiconductor substrate 20, and an insulating material is supplied to the groove.

Figure 3H:
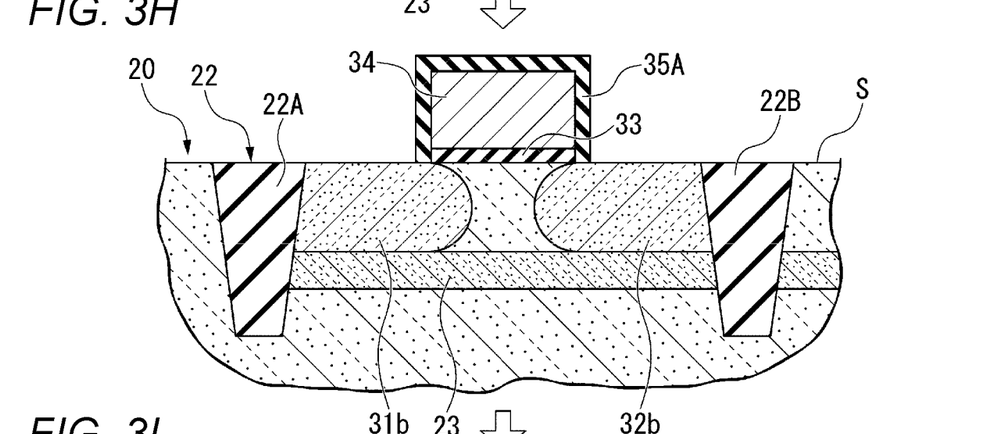

Next, as shown in FIG. 3H, a mask formed by an insulating layer 35A is formed for the gate electrode 34. Further, the low concentration diffusion region 31b of the source region 31 and the low concentration diffusion region 32b of the drain region 32 are formed by implanting low concentration ions.

Figure 3I:
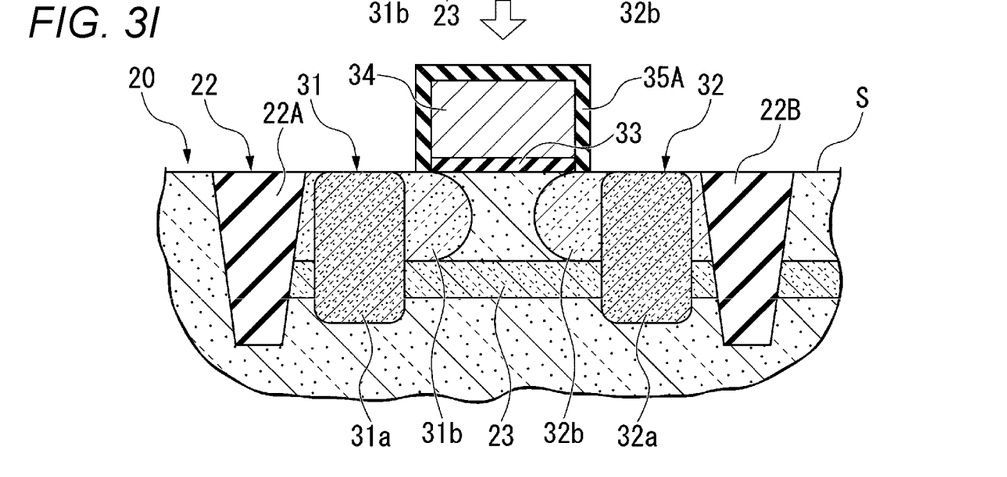

Next, as shown in FIG. 3I, the high concentration diffusion region 31a of the source region 31 and the high concentration diffusion region 32a of the drain region 32 are formed by implanting high concentration ions multiple times. Thereby, the source region 31 and the drain region 32 are formed.

Figure 3J:
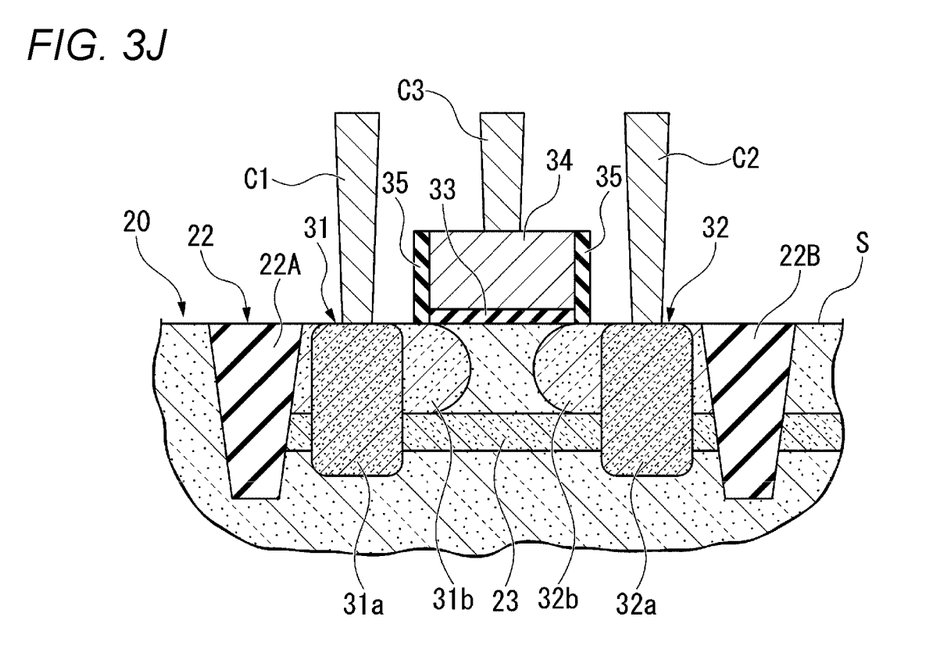

Next, as shown in FIG. 3J, an upper portion of the insulating layer 35A is removed by etching. Thereby, the insulating film 35 is formed from the insulating layer 35A. Further, the first contact electrode C1, the second contact electrode C2, and the third contact electrode C3 are formed. By so doing, manufacture relating to the semiconductor substrate 20 and the transistor 30A is completed.

4. Advantages

For example, when a high voltage transistor is used, a low concentration diffusion region having an LDD structure or the like may be provided. In this case, parasitic resistance may increase because a dose of the low concentration diffusion region is low. Also, when the low concentration diffusion region spreads in the Z direction, opposing areas of a low concentration diffusion region of a source region and a low concentration diffusion region of a drain region increase, and room for improvement occurs in terms of breakdown voltage relating to a punch-through current.

Therefore, in the present embodiment, the semiconductor substrate 20 has the diffusion restricting layer 23. The diffusion restricting layer 23 is positioned on a side opposite to that of the surface S of the semiconductor substrate 20 with respect to at least one of at least a part of the source region 31 and at least a part of the drain region 32. The diffusion restricting layer 23 includes a high concentration of germanium and carbon compared with that of the channel region C, and has a function of restricting impurity diffusion.

According to this kind of configuration, an impurity implanted when forming the source region 31 or the drain region 32 is unlikely to spread in the Z direction, but spreads easily in the X direction. As a result of this, a distance between the low concentration diffusion region 31b of the source region 31 and the low concentration diffusion region 32b of the drain region 32 decreases, and parasitic resistance decreases. Also, as an impurity is unlikely to spread in the Z direction, opposing areas of the low concentration diffusion region 31b of the source region 31 and the low concentration diffusion region 32b of the drain region 32 decrease, and punch-through current does not flow easily. Thereby, a breakdown voltage of the transistor 30A increases, and a large current flows easily as a current Ion between the source region 31 and the drain region 32. Thereby, characteristics of the transistor 30A improve, and an improvement in electrical characteristics of the semiconductor device 1 can be achieved.

In the present embodiment, the diffusion restricting layer 23 is positioned on a side opposite to that of the surface S of the semiconductor substrate 20 with respect to at least a part of the source region 31, at least a part of the drain region 32, and the channel region C. According to this kind of configuration, an impurity is unlikely to spread in the Z direction, but spreads easily in the X direction, in each of the source region 31, the drain region 32, and the channel region C. Thereby, the breakdown voltage of the transistor 30A and characteristics relating to the current Ion can be further improved.

In the present embodiment, the source region 31 includes the specific portion 31bs that coincides with the gate electrode 34 in the thickness direction of the semiconductor substrate 20 (the Z direction). The diffusion restricting layer 23 is positioned on a side opposite to that of the surface S of the semiconductor substrate 20 with respect to the specific portion 31bs. According to this kind of configuration, an impurity for forming the specific portion 31bs spreads more easily in the X direction. Thereby, characteristics of the transistor 30A (for example, characteristics relating to the current Ion) can be further improved.

In the present embodiment, the diffusion restricting layer 23 is positioned in a shallow region in the interior of the semiconductor substrate 20, as seen from the surface S of the semiconductor substrate 20, compared with a part of the high concentration diffusion region 31a. According to this kind of configuration, an impurity is less likely to spread in the Z direction. Thereby, characteristics of the transistor 30A (for example, the breakdown voltage) can be further improved.

In the present embodiment, the high concentration diffusion region 31a of the source region 31 has an impurity concentration of $1\times10^{17}$ atoms·cm$^{-3}$ or greater as far as a region deeper than the diffusion restricting layer 23 in the semiconductor substrate 20 as seen from the surface S. According to this kind of configuration, a large region including an impurity at a high concentration can be allocated as the source region 31. Thereby, characteristics of the transistor 30A can be further improved.

In the present embodiment, a method of manufacturing the semiconductor device 1 forms the diffusion restricting layer 23 by removing a part of the upper portion of the semiconductor substrate 20B. According to this kind of method, a layer including germanium and carbon at a necessary concentration is formed easily as the diffusion restricting layer 23.

In the present embodiment, as a method of manufacturing the semiconductor device 1, the semiconductor layer 41 is formed on the diffusion restricting layer 23 after the diffusion restricting layer 23 is formed. According to this kind of method, tensile stress can be expected to act on the semiconductor layer 41. When tensile stress acts on the semiconductor layer 41, mobility in the semiconductor layer 41 improves, and characteristics of the transistor 30A (for example, characteristics relating to the current Ion) can be further improved.

Heretofore, a semiconductor device of one embodiment has been described, but embodiments are not limited to the heretofore described example. For example, a semiconductor storage device to which the structure of the present embodiment is applicable is not limited to a NAND flash memory, but the structure may be applied to a NOR memory, a magnetoresistive random-access memory (MRAM), a resistive random-access memory, or the like. Also, the structure of the present embodiment is also applicable to a semiconductor device other than a semiconductor storage device.

According to the heretofore described at least one embodiment, a semiconductor device includes a substrate and a transistor. The transistor has a first diffusion layer region and a second diffusion layer region provided in the substrate, a gate insulating film provided on the substrate, and a gate electrode positioned on a side opposite to that of the substrate with respect to the gate insulating film. The substrate is positioned on a side opposite to that of the gate insulating film with respect to at least one of at least a part of the first diffusion layer region and at least a part of the second diffusion layer region, and has an internal layer in which a concentration of germanium and carbon is higher than that of a region between the first diffusion layer region and the second diffusion layer region. According to this kind of configuration, an improvement in electrical characteristics can be achieved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device, comprising:
a substrate;
a transistor having a first diffusion region and a second diffusion region provided in the substrate, a gate insulating film provided over the substrate between the first diffusion region and the second diffusion region, and a gate electrode positioned on the gate insulating film;
a well region positioned between the first diffusion region and the second diffusion region in a first direction parallel to the substrate and including a channel region; and
an internal layer positioned in the substrate, wherein the internal layer has a first concentration of germanium and carbon higher than a second concentration of germanium and carbon of a region between the first diffusion region and the second diffusion region, wherein the well region positioned between the internal layer and the gate insulating layer in a second direction perpendicular to the substrate.

2. The semiconductor device according to claim 1, wherein the first diffusion region and the second diffusion region respectively include portions below the gate electrode, and
the well region is interposed between the portions of the first and second diffusion regions.

3. The semiconductor device according to claim 1, wherein at least one of the first or second diffusion region has a high concentration diffusion region having a first impurity concentration, and a low concentration diffusion region, with the same polarity as the high concentration diffusion region, that has a second impurity concentration lower than the first impurity concentration, and
the internal layer is positioned opposite the low concentration diffusion region from the gate insulating film.

4. The semiconductor device according to claim 3, wherein the low concentration diffusion region is a low concentration impurity drain region.

5. The semiconductor device according to claim 3, wherein the substrate has a surface in contact with the internal layer, and
the high concentration diffusion region has a bottom surface below the surface of the substrate.

6. The semiconductor device according to claim 5, wherein the high concentration diffusion region has a region with an impurity concentration equal to or greater than $1 \times 10^{17}$ atoms·cm$^{-3}$, the region extending below the surface of the substrate.

7. The semiconductor device according to claim 3, wherein the high concentration diffusion region extends through the internal layer into the substrate.

8. A method for fabricating semiconductor devices, comprising:
removing a portion of a substrate to form a recess;
forming an internal layer lining a bottom surface of the recess;
growing a semiconductor layer over the internal layer; and
forming, over the internal layer, a first diffusion region and a second diffusion region each extending through the semiconductor layer, wherein a portion of the semiconductor layer extending between the first and second diffusion regions includes a channel region;
wherein internal layer has a first concentration of germanium and carbon higher than a second concentration of germanium and carbon of a region of the semiconductor layer between the first diffusion region and the second diffusion region.

9. The method according to claim 8, prior to forming the first and second diffusion regions, further comprising:
forming a gate electrode over the semiconductor layer; and
covering a top surface and sidewalls of the gate electrode with an insulating layer.

10. The method according to claim 9, further comprising:
forming the first and second diffusion regions using the insulating layer as a mask; and
removing the insulating layer.

11. The method according to claim 8, wherein each of the first and second diffusion regions has a high concentration diffusion region having a first impurity concentration, and a low concentration diffusion region, with the same polarity as the high concentration diffusion region, that has a second impurity concentration lower than the first impurity concentration.

12. The method according to claim 11, further comprising:
forming a contact electrode in contact with the respective high concentration diffusion region of each of the first and second diffusion regions.

13. The method according to claim 11, wherein the high concentration diffusion region has a region with an impurity concentration equal to or greater than $1 \times 10^{17}$ atoms·cm$^{-3}$, the region extending below an interface between the internal layer and the substrate.

* * * * *